(12) United States Patent
Fujita

(10) Patent No.: US 9,292,024 B2
(45) Date of Patent: Mar. 22, 2016

(54) POWER GATING CIRCUIT

(71) Applicant: KABUSHIKI KAISHA TOSHIBA, Tokyo (JP)

(72) Inventor: Tetsuya Fujita, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 72 days.

(21) Appl. No.: 14/195,007

(22) Filed: Mar. 3, 2014

(65) Prior Publication Data

US 2015/0070087 A1 Mar. 12, 2015

(30) Foreign Application Priority Data

Sep. 6, 2013 (JP) .................... 2013-185610

(51) Int. Cl.
*G05F 3/02* (2006.01)
*G05F 1/46* (2006.01)
*H03K 19/00* (2006.01)

(52) U.S. Cl.
CPC .............. *G05F 1/46* (2013.01); *H03K 19/0016* (2013.01)

(58) Field of Classification Search
CPC .......... H03K 19/0013; H03K 19/0016; H03K 19/003; H03K 19/00315; H03K 19/00323
USPC ......... 327/392, 398, 399, 401, 403, 404, 419, 327/427, 434, 437, 544, 574, 576, 581
See application file for complete search history.

(56) References Cited

U.S. PATENT DOCUMENTS

| 6,118,325 | A  | * | 9/2000  | Nakamura ..................... | 327/384 |
| 7,659,773 | B2 | * | 2/2010  | Choi et al. ..................... | 327/544 |
| 8,648,654 | B1 | * | 2/2014  | Myers et al. ..................... | 327/565 |
| 2007/0052470 | A1 | * | 3/2007  | Sellmair et al. ................ | 327/419 |
| 2008/0272809 | A1 | * | 11/2008 | Idgunji et al. ................... | 327/78 |
| 2012/0200345 | A1 | * | 8/2012  | Kim .............................. | 327/543 |
| 2014/0015590 | A1 | * | 1/2014  | Yoon et al. ..................... | 327/378 |
| 2014/0097702 | A1 | * | 4/2014  | Upputuri et al. ............... | 307/115 |
| 2015/0028943 | A1 | * | 1/2015  | Govindaraj et al. .......... | 327/543 |

FOREIGN PATENT DOCUMENTS

| JP | 2003168735   |   | 6/2003  |
| JP | 2008-072113  | A | 3/2008  |
| JP | 2009170651   |   | 7/2009  |
| JP | 2008-166152  |   | 1/2010  |
| JP | 2011120158   |   | 6/2011  |
| JP | 2012227269   |   | 11/2012 |

OTHER PUBLICATIONS

Japanese Office Action dated Dec. 15, 2015, filed in Japanese application No. 2013-185610, 16 pages (with translation).

* cited by examiner

*Primary Examiner* — William Hernandez
(74) *Attorney, Agent, or Firm* — Patterson & Sheridan, LLP

(57) ABSTRACT

A semiconductor integrated circuit includes a first power supply line to which an input power supply voltage is to be applied, a second power supply line configured to supply a bias voltage to a load circuit, a MOS transistor having a source-drain current path connected between the first and second power supply lines, an NMOS transistor having a source-drain current path connected between the first and second power supply lines, and a control circuit configured to generate a first control signal that is supplied to a gate electrode of the PMOS transistor at a first point in time, and a second control signal that is boosted to have a voltage level higher than the input power supply voltage and then supplied to a gate electrode of the NMOS transistor at a second point in time point that is after the first point in time.

15 Claims, 9 Drawing Sheets

POWER GATING CIRCUIT

CROSS-REFERENCE TO RELATED APPLICATION

This application is based upon and claims the benefit of priority from Japanese Patent Application No. 2013-185610, filed Sep. 6, 2013, the entire contents of which are incorporated herein by reference.

FIELD

Embodiments described herein relate generally to a semiconductor integrated circuit including a power supply switch circuit.

BACKGROUND

A semiconductor integrated circuit of the related art includes a power supply switch circuit provided between a power supply line to which an input power supply voltage is applied, and a power supply line of a load circuit. As a way to decrease the current as much as possible, the power supply switch circuit is turned off except when it is needed by the load circuit for operation. Also, the power supply voltage of the load circuit is required to rise quickly when necessary and an inrush current needs to be suppressed in such a manner that the rising of the power supply voltage of the load circuit does not inadvertently cause an operation for protecting against inrush currents to be performed.

DETAILED DESCRIPTION

Embodiments provide a semiconductor integrated circuit including a high-speed power supply switch circuit which is appropriate to circuit integration and has little variation in rising time.

In general, according to one embodiment, a semiconductor integrated circuit includes a first power supply line to which an input power supply voltage is to be applied, a second power supply line configured to supply a power supply voltage to a load circuit, a first MOS transistor having a source-drain current path connected between the first power supply line and the second power supply line, and a gate electrode, an NMOS transistor having a source-drain current path connected between the first power supply line and the second power supply line, and a gate electrode, and a control circuit configured to generate a first control signal that is supplied to the gate electrode of the first PMOS transistor at a first point in time, and a second control signal that is boosted to have a voltage level higher than the input power supply voltage and then supplied to the gate electrode of the NMOS transistor at a second point in time point that is a predetermined time after the first point in time.

Hereinafter, a semiconductor integrated circuit according to embodiments will be described in detail with respect to the accompanying drawings. In addition, the embodiments are not intended to be limiting.

(First Embodiment)

Figure 1:
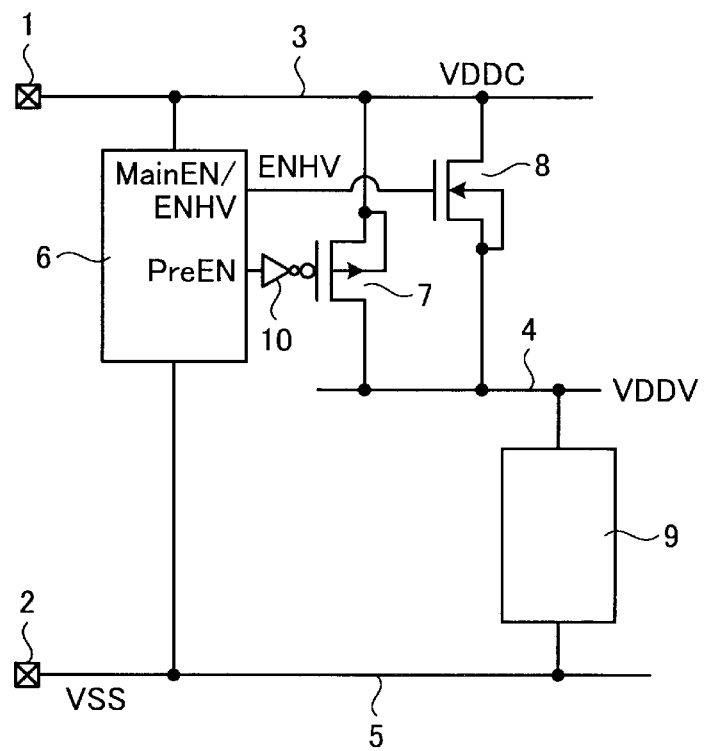
FIG. 1 is a diagram illustrating a semiconductor integrated circuit of a first embodiment.

FIG. 1 is a diagram illustrating a semiconductor integrated circuit according to a first embodiment. The semiconductor integrated circuit according to the embodiment includes a first power supply terminal 1 and a second power supply terminal 2. The semiconductor integrated circuit further includes a first power supply line 3, a second power supply line 4, and a third power supply line 5. An input power supply voltage VDDC is applied to the first power supply terminal 1. The first power supply terminal 1 is connected to the first power supply line 3. A ground potential VSS is applied to the second power supply terminal 2. The second power supply terminal 2 is connected to the third power supply line 5. The semiconductor integrated circuit includes a first pre-switch PMOS transistor 7 having a source electrode connected to the first power supply line 3 and a drain electrode connected to the second power supply line 4. A back gate electrode of the first pre-switch PMOS transistor 7 is connected to the source electrode of the PMOS transistor 7. The semiconductor integrated circuit includes a main switch NMOS transistor 8 having a source electrode connected to the second power supply line 4 and a drain electrode connected to the first power supply line 3. A back gate electrode of the main switch NMOS transistor 8 is connected to the source electrode of the main switch NMOS transistor 8. A load circuit 9 is connected to the second power supply line 4 and the third power supply line 5. The load circuit 9 is biased by an output voltage VDDV through the second power supply line 4.

The semiconductor integrated circuit includes a control circuit 6 which generates a control signal that controls turning on and off of the main switch NMOS transistor 8 and the first pre-switch PMOS transistor 7. A pre-enable signal PreEN is supplied to the gate electrode of the first pre-switch PMOS transistor 7, from the control circuit 6, through an inverter 10. A driving signal ENHV is supplied to the gate electrode of the main switch NMOS transistor 8 from the control circuit 6.

Figure 2:
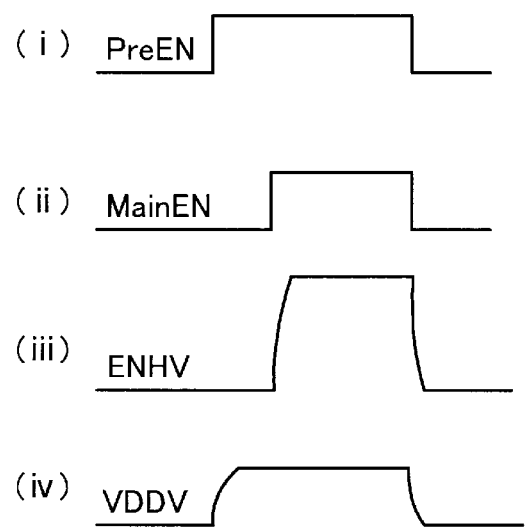
FIG. 2 is a diagram schematically illustrating operational waveforms of the semiconductor integrated circuit according to the first embodiment.

An operation according to the first embodiment will be described by using operational waveforms illustrated in FIG. 2. The control circuit 6 generates the pre-enable signal PreEN (FIG. 2(i)). When a predetermined time elapses from the rising edge of the pre-enable signal PreEN, a main enable signal MainEN is generated (FIG. 2(ii)). In response to the main enable signal MainEN, a charge pump circuit (not illustrated) generates the driving signal ENHV (FIG. 2(iii)). The driving signal ENHV is supplied to the gate electrode of the main switch NMOS transistor 8.

For example, the driving signal ENHV is generated by boosting the input power supply voltage VDDC up to a predetermined voltage using the charge pump circuit (not illustrated) in the control circuit 6. A voltage of the driving signal ENHV is applied such that the voltage of the driving signal ENHV does not exceed a rated voltage of the main switch NMOS transistor 8. When first pre-switch PMOS transistor 7 is turned on, the output voltage VDDV of the second power supply line 4 is boosted up to approximately the input power supply voltage VDDC, and thus a voltage which can make the main switch NMOS transistor 8 to turn on is generated. In addition, the voltage of the driving signal ENHV is selected by considering that a driving capacity of the main switch NMOS transistor 8 can be fully used. For example, when the rated voltage between the gate electrode and the source electrode, the rated voltage between the gate electrode and the drain electrode, and the rated voltage between the source electrode and the drain electrode of the main switch NMOS transistor 8 are designed using the same voltage VDDC as the input power supply voltage VDDC, the driving signal ENHV is boosted up to a voltage twice the input power supply voltage VDDC. The back gate electrode of the main switch NMOS transistor 8 is connected to the source electrode of the main switch NMOS transistor 8, and thereby increase of a threshold voltage according to a back gate effect is avoided. As a result, it is possible to prevent the on-resistance of the main switch NMOS transistor 8 from increasing.

The pre-enable signal PreEN is applied to the gate electrode of the first pre-switch PMOS transistor 7 after being inverted by the inverter 10, and thereby the first pre-switch PMOS transistor 7 is turned on. Thus, the output voltage VDDV of the second power supply line 4 rises (FIG. 2(iv)).

In the embodiment, the NMOS transistor 8 having a driving capacity greater than that of a PMOS transistor is used as a main switch transistor. Thus, although a size of the main switch NMOS transistor 8 is small, the main switch NMOS transistor 8 can supply a sufficient current to the load circuit 9. Since the size of the main switch NMOS transistor 8 is small, a leakage current when turned off can be decreased, and thereby unnecessary power consumption can be reduced. In addition, after the output voltage VDDV of the second power supply line 4 rises due to the first pre-switch PMOS transistor 7 being turned on, the main switch NMOS transistor 8 is turned on, and in a state where the voltage between the source electrode and the drain electrode of the main switch NMOS transistor 8 becomes small, the main switch NMOS transistor 8 is turned on. Thus, it is possible to suppress an inrush current from occurring when the main switch NMOS transistor 8 is turned on. Further, since the on-resistance of the main switch NMOS transistor 8 is small, when the main switch NMOS transistor 8 is turned on, the output voltage VDDV of the second power supply line 4 can be increased to approximately the input power supply voltage VDDC of the first power supply line 3.

(Second Embodiment)

Figure 3:
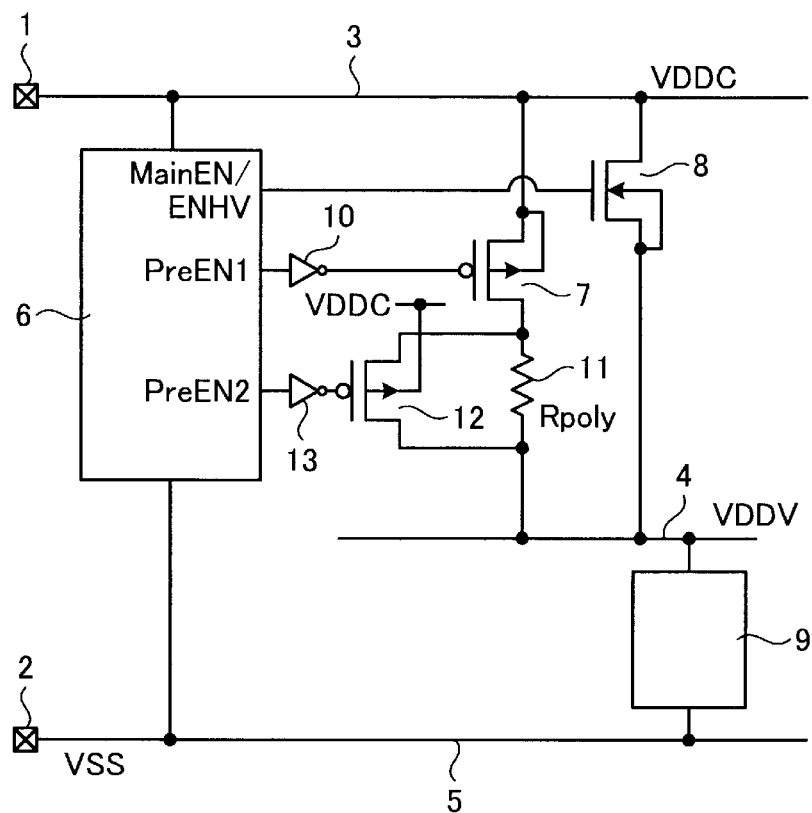
FIG. 3 is a diagram illustrating a semiconductor integrated circuit according to a second embodiment.

FIG. 3 is a diagram illustrating a semiconductor integrated circuit according to a second embodiment. The elements of the second embodiment corresponding to the semiconductor integrated circuit according to the first embodiment are denoted by same reference numerals, and description thereof will not be repeated. In the embodiment, a resistor 11 is connected to the drain electrode of the first pre-switch PMOS transistor 7 and the second power supply line 4. The resistor 11 is formed of materials with small variation in resistance value, such as polysilicon. The semiconductor integrated circuit includes a second pre-switch PMOS transistor 12 having a source electrode connected to one end of the resistor 11 and a drain electrode connected to the other end of the resistor 11. A back gate electrode of the second pre-switch PMOS transistor 12 is connected to the first power supply line 3.

Figure 4:
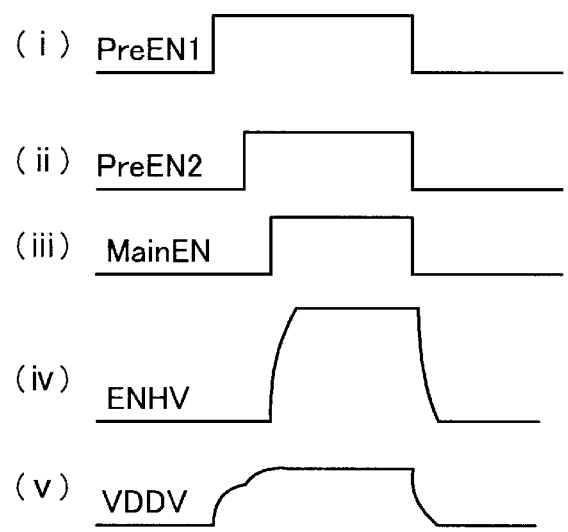
FIG. 4 is a diagram schematically illustrating first operational waveforms of the semiconductor integrated circuit according to the second embodiment.

An operation according to the second embodiment will be described by using operational waveforms illustrated in FIG. 4. The control circuit 6 outputs a first pre-enable signal PreEN1 (FIG. 4(i)). When a predetermined time elapses after the first pre-enable signal PreEN1 is output, a second pre-enable signal PreEN2 is output (FIG. 4(ii)). Further, when a predetermined time elapses after the second pre-enable signal PreEN2 is output, the main enable signal MainEN is generated (FIG. 4(iii)). In response to the main enable signal MainEN, a charge pump circuit (not illustrated) configured in the control circuit 6 generates the driving signal ENHV (FIG. 4(iv)). For example, the driving signal ENHV is boosted up to a value twice the input power supply voltage VDDC. The driving signal ENHV is supplied to the gate electrode of the main switch NMOS transistor 8.

The first pre-enable signal PreEN1 is inverted by the inverter 10 and then applied to the gate electrode of the first pre-switch PMOS transistor 7, and thereby the first pre-switch PMOS transistor 7 is turned on. As a result, the output voltage VDDV of the second power supply line 4 rises rapidly and precisely with the RC time constant, by means of the highly precise resistor 11. At this time, the output voltage VDDV of the second power supply line 4 is lowered, the lowered voltage being equal to the voltage of the first power supply line 3 minus a voltage drop due to the on-resistance of the first pre-switch PMOS transistor 7, a voltage drop due to the resistor 11, and a voltage drop due to a load current.

The second pre-enable signal PreEN2 is inverted by an inverter 13 and then applied to the gate electrode of the second pre-switch PMOS transistor 12, and thereby the second pre-switch PMOS transistor 12 is turned on. As a result, the resistor 11 is shunted by a source-drain current path of the second pre-switch PMOS transistor 12. For this reason, the voltage drop due to the resistor 11 has very little effect, and the output voltage VDDV of the second power supply line 4 rises nearly up to the input power supply voltage VDDC (FIG. 4(v)). When a predetermined time elapses from rising edge of the second pre-enable signal PreEN2, the main enable signal MainEN is output and then supplied to the gate electrode of the main switch NMOS transistor 8 (FIG. 4(iv)). As a result, the main switch NMOS transistor 8 is turned on.

In the embodiment, an NMOS transistor with a high driving capacity is used as the main switch NMOS transistor 8. For this reason, although the size of the main switch NMOS transistor 8 is small, sufficient current can be supplied to the load circuit 9. Since the size of the main switch NMOS transistor 8 is small, the leakage current when the main switch NMOS transistor 8 is turned off can be decreased. As a result, unnecessary power consumption can be reduced. In addition, the resistor 11 is connected to the first pre-switch PMOS transistor 7, and thereby the inrush current when the first pre-switch PMOS transistor 7 is turned on is suppressed. Further, after the first pre-switch PMOS transistor 7 and the second pre-switch PMOS transistor 12 are turned on, and the output voltage VDDV of the second power supply line 4 rises, the main switch NMOS transistor 8 is turned on. Thus, since the voltage between the source electrode and the drain electrode of the main switch NMOS transistor 8 becomes small, when the main switch NMOS transistor 8 is turned on, it is possible to suppress the inrush current from occurring when the main switch NMOS transistor 8 is turned on.

Figure 5:
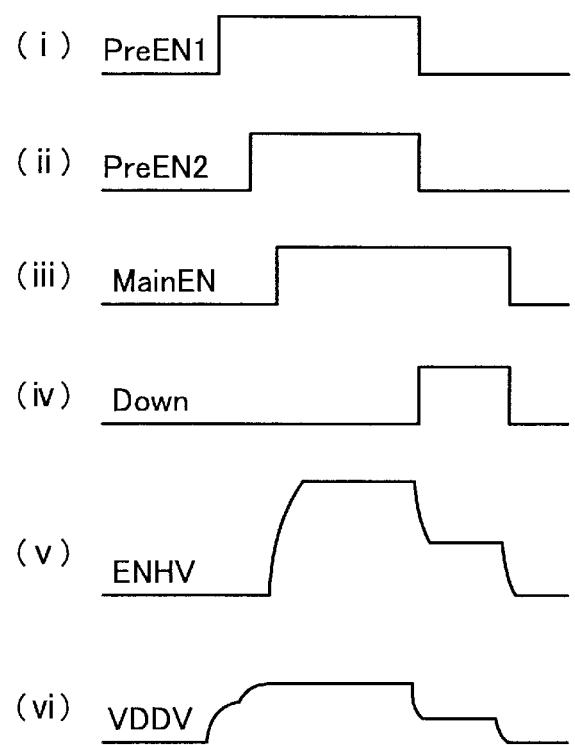
FIG. 5 is a diagram schematically illustrating second operational waveforms of the semiconductor integrated circuit according to the second embodiment.

FIG. 5 is a diagram schematically illustrating second operational waveforms of a semiconductor integrated circuit according to the second embodiment. In the operational waveforms illustrated in FIG. 5, even after the first pre-enable signal PreEN1 and the second pre-enable signal PreEN2 fall, the main enable signal MainEN has a time period of a high state (FIGS. 5(i), 5-(ii) and 5-(iii)). In other words, even after the first pre-switch PMOS transistor 7 and the second pre-switch PMOS transistor 12 are turned off, the main switch NMOS transistor 8 has a time period during which its on state is maintained. During this time period, a control signal Down, which leads to a voltage step-down operation of the charge pump circuit (not illustrated) in the control circuit 6, is generated (FIG. 5-(iv)), and a signal level of the driving signal ENHV output from the control circuit 6 is lowered (FIG. 5(v)). The level of the driving signal ENHV is maintained to be at a voltage which can turn on the main switch NMOS transistor 8, and thereby a voltage that is equal to the driving signal ENHV minus a gate-source voltage of the main switch NMOS transistor 8 can be supplied to the second power supply line 4 (FIG. 5(vi)). In other words, the main switch NMOS transistor 8 is used as a source follower circuit, and thereby an arbitrary voltage which is changed in response to voltage changes of the driving signal ENHV can be supplied to the second power supply line 4.

(Third Embodiment)

Figure 6:
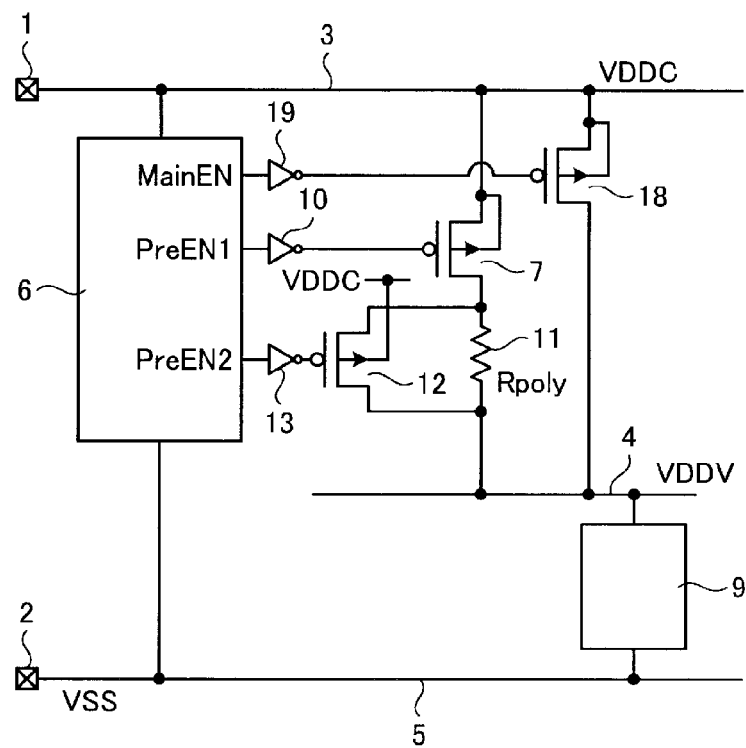
FIG. 6 is a diagram illustrating a semiconductor integrated circuit according to a third embodiment.

FIG. 6 is a diagram illustrating a semiconductor integrated circuit according to a third embodiment. The elements of the third embodiment corresponding to the semiconductor integrated circuit according to the above described embodiments are denoted by same reference numerals, and description thereof will not be repeated. In the embodiment, the semiconductor integrated circuit includes a PMOS transistor 18 as the main switch transistor. A source electrode of the main switch PMOS transistor 18 is connected to the first power supply line 3, and a drain electrode of the main switch PMOS transistor 18 is connected to the second power supply line 4. A back gate electrode of the main switch PMOS transistor 18 is connected to the first power supply line 3.

An operation according to the third embodiment will be described by using operational waveforms illustrated in FIG. 7. The control circuit 6 outputs the first pre-enable signal PreEN1 at a predetermined time (FIG. 7(i)). The first pre-enable signal PreEN1 is inverted by the inverter 10, and supplied to the gate electrode of the first pre-switch PMOS transistor 7. As a result, the first pre-switch PMOS transistor 7 is turned on. A maximum value of an inrush current flowing at this time is expressed by the following formula (1).

[Formula 1]

$$Irush1 = VDDC \div (R_7 + Rpoly) \quad (1)$$

In formula (1), VDDC denotes the input power supply voltage, $R_7$ denotes the on-resistance of the first pre-switch PMOS transistor 7, and Rpoly denotes the resistor 11.

Due to a voltage difference between the first power supply line 3 and the second power supply line 4, a current in which the current Irush1 is set as an upper limit flows, and the voltage difference between the first power supply line 3 and the second power supply line 4 is reduced to Vdrop1. The voltage difference Vdrop1 can be expressed by the following formula (2).

[Formula 2]

$$Vdrop1 = I \times (R_7 + Rpoly) \quad (2)$$

In formula (2), the load current I is a consumed current of the load circuit in a stop state and a current that is much smaller than Irush1. For this reason, a relationship between the voltage difference Vdrop1 and the input power supply voltage VDDC can be expressed by the following formula (3).

[Formula 3]

$$Vdrop1 \ll VDDC \quad (3)$$

Thus, the voltage of the second power supply line 4 rises greatly. In other words, a resistance value in which $R_7$ and Rpoly are added together determines that most of the time when the voltage of the second power supply line 4 rises greatly. In order to perform a high-speed rising, it is necessary to fix the resistance value without variation. For example, it is important in the high-speed rising that a rising time of the voltage of the second power supply line 4 is determined to be sharp by using a precise resistor formed by polysilicon for Rpoly.

Figure 7:
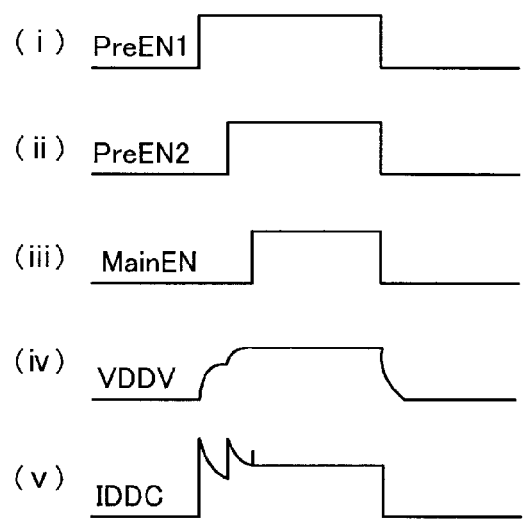
FIG. 7 is a diagram schematically illustrating operational waveforms of the semiconductor integrated circuit of according to the third embodiment.

At the timing when a predetermined time elapses from the rising edge of the first pre-enable signal PreEN1, the second pre-enable signal PreEN2 is generated (FIG. 7(ii)). The second pre-enable signal PreEN2 is inverted by the inverter 13 and supplied to the gate electrode of the second pre-switch PMOS transistor 12. As a result, the second pre-switch PMOS transistor 12 is turned on. The maximum value of the inrush current flowing at this time is expressed by the following formula (4).

[Formula 4]

$$Irush2 = (R_7 + Rpoly) \times I \div \left( R_7 + \frac{1}{\frac{1}{Rpoly} + \frac{1}{R_{12}}} \right) \quad (4)$$

In formula (4), $R_{12}$ denotes the on-resistance of the second pre-switch PMOS transistor 12.

At the timing when a predetermined time elapses from the rising edge of the second pre-enable signal PreEN2, the main enable signal MainEN is generated (FIG. 7(iii)), inverted by an inverter 19, and applied to a gate electrode of the main switch PMOS transistor 18. As a result, the main switch PMOS transistor 18 is turned on.

The output voltage VDDV of the second power supply line 4 rises rapidly when the first pre-switch PMOS transistor 7 is turned on. Then, the output voltage VDDV rises to a voltage equal to the input power supply voltage VDDC minus a voltage drop due to the resistor 11 and a voltage drop due to the on-resistance of the first pre-switch PMOS transistor 7.

The second pre-switch PMOS transistor 12 is turned on, and thereby the resistor 11 is shunted by the source-drain current path of the second pre-switch PMOS transistor 12. For this reason, there is no longer a voltage drop due to the resistor 11, and the output voltage VDDV of the second power supply line 4 rises up to approximately the input power supply voltage VDDC (FIG. 7(iv)). When a predetermined time elapses from the rising edge of the second pre-enable signal PreEN2, the main enable signal MainEN is output (FIG. 7(iii)), and supplied to the gate electrode of the main switch PMOS transistor 18. As a result, the main switch PMOS transistor 18 is turned on. The maximum value of the inrush current flowing at this time is expressed by the following formula (5).

[Formula 5]

$$Irush3 = \left(R_7 + \frac{1}{\frac{1}{Rpoly} + \frac{1}{R_{12}}}\right) \times I \div \frac{1}{R_7 + \frac{1}{\frac{1}{Rpoly} + \frac{1}{R_{12}}}} + \frac{1}{R_{18}} \quad (5)$$

In formula (5), $R_{18}$ denotes the on-resistance of the main switch PMOS transistor 18. FIG. 7(*v*) illustrates a power supply current flowing through the first power supply line 3.

A resistance value of each element sets a relationship of the inrush currents as expressed below in formula (6), and is determined by allocation of Irush1, Irush2, or Irush3 in such a manner that each inrush current does not exceed an acceptable level. In other words, Irush1, Irush2, or Irush3 can be obtained by substituting right sides of formulas (1), (4) and (5) into formula (6). When the inrush current exceeds permissible levels with only the first and second pre-switches, the inrush current is shunted with a new third pre-switch added.

[Formula 6]

$$Irush \approx Irush1 \approx Irush2 \approx Irush3 \quad (6)$$

(Fourth Embodiment)

Figure 8:
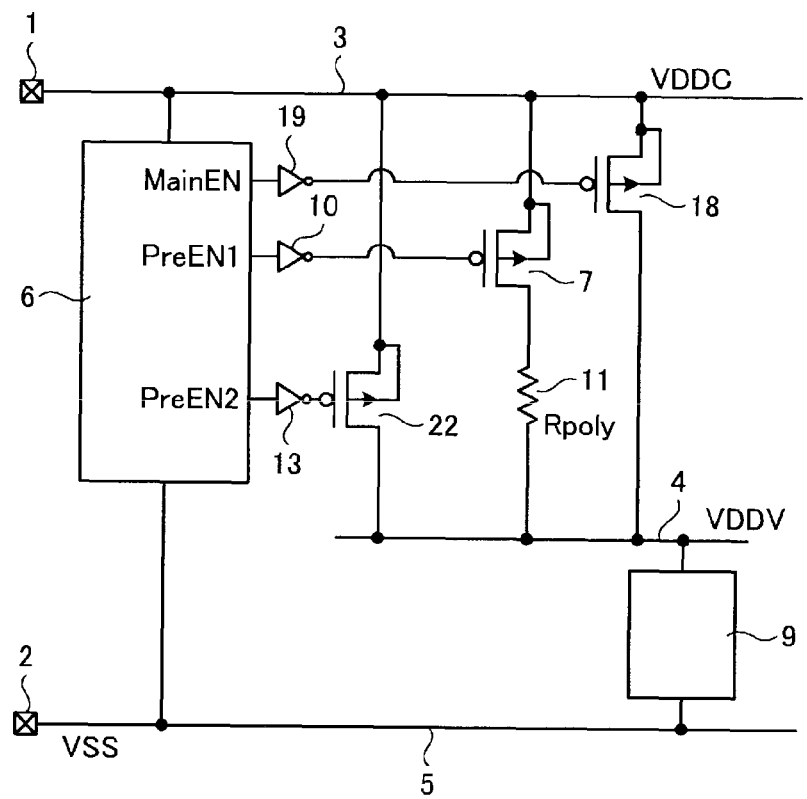
FIG. 8 is a diagram illustrating a semiconductor integrated circuit according to a fourth embodiment.

FIG. 8 is diagram illustrating a semiconductor integrated circuit according to a fourth embodiment. The elements of the fourth embodiment corresponding to the semiconductor integrated circuit according to the above described embodiments are denoted by same reference numerals, and description thereof will not be repeated. In the embodiment, the semiconductor integrated circuit includes a third pre-switch PMOS transistor 22 having a source electrode connected to the first power supply line 3, and a drain electrode connected to the second power supply line 4. A back gate electrode of the third pre-switch PMOS transistor 22 is connected to the first power supply line 3.

An operation according to the fourth embodiment will be described by using operational waveforms illustrated in FIG. 9. The control circuit 6 outputs the first pre-enable signal PreEN1 at a predetermined time (FIG. 9(*i*)). The first pre-enable signal PreEN1 is inverted by the inverter 10, and supplied to the gate electrode of the first pre-switch PMOS transistor 7. As a result, the first pre-switch PMOS transistor 7 is turned on. The maximum value of the inrush current flowing at this time is expressed by the following formula (7).

[Formula 7]

$$Irush1 = VDDC \div (R_7 + Rpoly) \quad (7)$$

In formula (7), VDDC denotes the input power supply voltage, $R_7$ denotes the on-resistance of the first pre-switch PMOS transistor 7, and Rpoly denotes the resistor 11.

Figure 9:
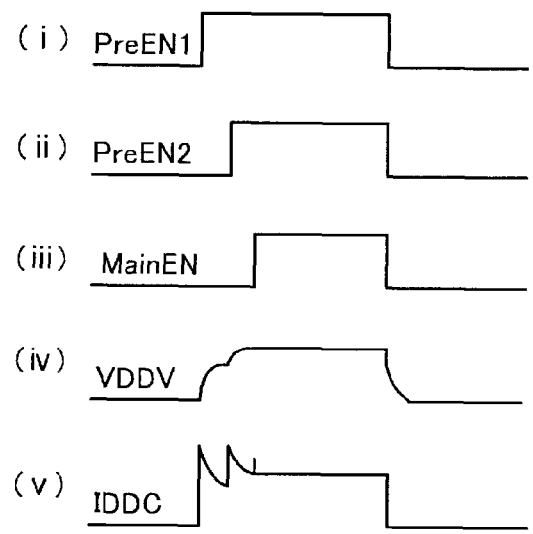
FIG. 9 is a diagram schematically illustrating operational waveforms of the semiconductor integrated circuit according to the fourth embodiment.

At the timing when a predetermined time elapses from the rising edge of the first pre-enable signal PreEN1, the second pre-enable signal PreEN2 is generated (FIG. 9(*ii*)). The second pre-enable signal PreEN2 is inverted by the inverter 13 and supplied to the gate electrode of the third pre-switch PMOS transistor 22. As a result, the third pre-switch PMOS transistor 22 is turned on. A maximum value of an inrush current flowing at this time is expressed by the following formula (8).

[Formula 8]

$$Irush2 = (R_7 + Rpoly) \times I \div \left(\frac{1}{\frac{1}{R_7 + Rpoly} + \frac{1}{R_{22}}}\right) \quad (8)$$

In formula (8), $R_{22}$ denotes the on-resistance of the third pre-switch PMOS transistor 22 and I denotes the load current.

When a predetermined time elapses from the rising edge of the second pre-enable signal PreEN2, the main enable signal MainEN is generated (FIG. 9(*iii*)). The main enable signal MainEN is inverted by the inverter 19, and applied to the gate electrode of the main switch PMOS transistor 18. As a result, the main switch PMOS transistor 18 is turned on.

The output voltage VDDV of the second power supply line 4 rises when the first pre-switch PMOS transistor 7 is turned on. Then, the output voltage VDDV rises to a voltage equal to the input power supply voltage VDDC minus the voltage drop due to the resistor 11 and the voltage drop due to the on-resistance of the first pre-switch PMOS transistor 7 (FIG. 9(*iv*)).

The third pre-switch PMOS transistor 22 is turned on, and thereby the first pre-switch PMOS transistor 7 and the resistor 11 are shunted by a source-drain current path of the third pre-switch PMOS transistor 22. For this reason, there is no longer a voltage drop due to the resistor 11, and the output voltage VDDV of the second power supply line 4 rises up to approximately the input power supply voltage VDDC (FIG. 9(*iv*)). When a predetermined time elapses from the rising edge of the second pre-enable signal PreEN2, the main enable signal MainEN is output (FIG. 9(*iii*)), and supplied to the gate electrode of the main switch PMOS transistor 18. As a result, the main switch PMOS transistor 18 is turned on. A maximum value of an inrush current flowing at this time is expressed by the following formula (9).

[Formula 9]

$$Irush3 = \frac{1}{\frac{1}{R_7 + Rpoly} + \frac{1}{R_{22}}} \times I \div \frac{1}{\frac{1}{R_{7+Rpoly}} + \frac{1}{R_{22}} + \frac{1}{R_{18}}} \quad (9)$$

FIG. 9 (*v*) illustrates a power supply current flowing through the first power supply line 3.

A resistance value of each element sets a relationship of the inrush currents as expressed below in formula (10), and is determined by allocation of Irush1, Irush2, or Irush3 in such a manner that each inrush current does not exceed the acceptable level. In other words, Irush1, Irush2, or Irush3 can be obtained by substituting right sides of formulas (7), (8) and (9) into formula (10). When the inrush current exceeds permissible levels with only the first and second pre-switches, the inrush current is shunted with a new third pre-switch added.

[Formula 10]

$$Irush \approx Irush1 \approx Irush2 \approx Irush3 \quad (10)$$

(Fifth Embodiment)

Figure 10:
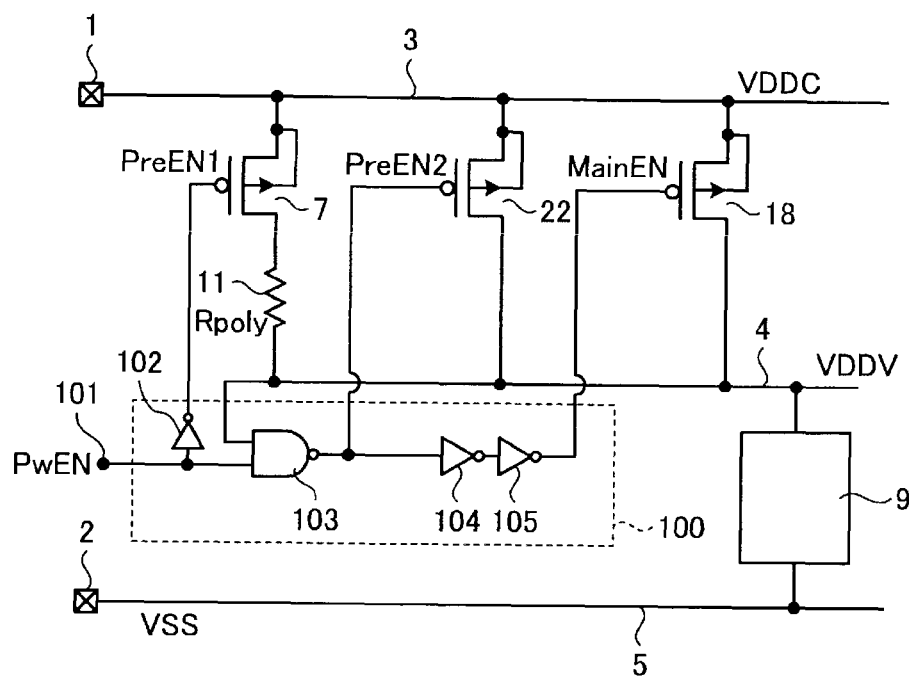
FIG. 10 is a diagram illustrating a semiconductor integrated circuit according to a fifth embodiment.

FIG. 10 is diagram illustrating a semiconductor integrated circuit according to a fifth embodiment. The elements of the fifth embodiment corresponding to the semiconductor integrated circuit according to the above described embodiments are denoted by same reference numerals, and description thereof will not be repeated. In the embodiment, the semiconductor integrated circuit includes a signal generation circuit 100 generating a control signal, in response to the enable signal PwEN, which controls turning on and off of the first pre-switch PMOS transistor 7, the second pre-switch PMOS transistor 22 and the main switch PMOS transistor 18. The signal generation circuit 100 corresponds to the control circuit 6 according to the above described embodiments. The signal generation circuit 100 includes a terminal 101 to which the enable signal PwEN is supplied. The signal generation circuit 100 includes an inverter 102. The enable signal PwEN is inverted by the inverter 102 and supplied to the gate electrode of the first pre-switch PMOS transistor 7.

The signal generation circuit 100 includes a NAND circuit 103. The enable signal PwEN is supplied to one input terminal of the NAND circuit 103. The other input terminal of the NAND circuit 103 is connected to the second power supply line 4. An output of the NAND circuit 103 is connected to the gate electrode of the second pre-switch PMOS transistor 22. Further, the output of the NAND circuit 103 is supplied to the gate electrode of the main switch PMOS transistor 18 through two stages of inverter circuits 104 and 105.

An operation according to the fifth embodiment will be described by using operational waveforms illustrated in FIG. 11. The enable signal PwEN is supplied to the signal generation circuit 100 (FIG. 11 (ii)). The inverter 102 inverts the enable signal PwEN, and generates the first pre-enable signal PreEN1 (FIG. 11(ii)). The first pre-enable signal PreEN1 is supplied to the gate electrode of the first pre-switch PMOS transistor 7. As a result, the first pre-switch PMOS transistor 7 is turned on. The first pre-switch PMOS transistor 7 is turned on, and thereby the output voltage VDDV of the second power supply line 4 rises rapidly and precisely with the RC time constant by means of the highly precise resistor 11. The first pre-switch PMOS transistor 7 is turned on, and the output voltage VDDV of the second power supply line 4 rises up to a voltage equal to the input power supply voltage VDDC minus the voltage drop due to the on-resistance of the first pre-switch PMOS transistor 7 and the voltage drop due to the resistor 11.

Figure 11:
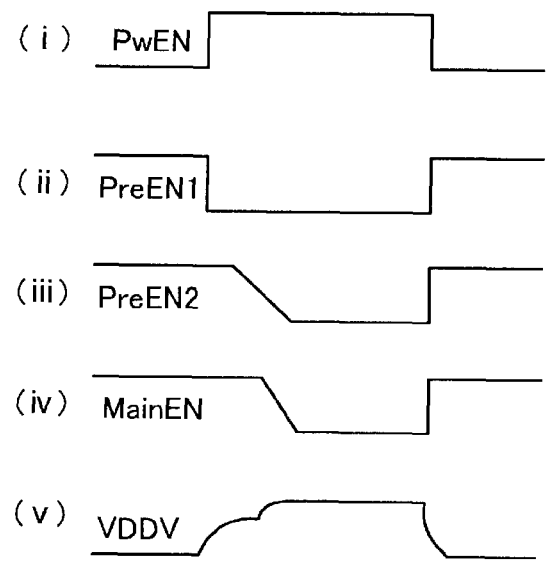
FIG. 11 is a diagram schematically illustrating operational waveforms of the semiconductor integrated circuit according to the fifth embodiment.

The NAND circuit 103 generates the second pre-enable signal PreEN2, when two inputs to the NAND circuit 103 are a high level (FIG. 11(iii)). The second pre-enable signal PreEN2 is supplied to the gate electrode of the second pre-switch PMOS transistor 22. As a result, the second pre-switch PMOS transistor 22 is turned on. The second pre-switch PMOS transistor 22 is turned on and thereby the output voltage VDDV of the second power supply line 4 rises up to approximately the input power supply voltage VDDC (FIG. 11(v)).

A circuit threshold value of the NAND circuit 103 is set to be high, and thereby the second pre-enable signal PreEN2 can be set to output when the output voltage VDDV of the second power supply line 4 rises up to a voltage that is near the input power supply voltage VDDC. According to such an adjustment, it is possible to suppress an inrush current when the second pre-switch PMOS transistor 22 is turned on and the main switch PMOS transistor 18 is turned on.

The output signal PreEN2 of the NAND circuit 103 is inverted by the two stages of inverters 104 and 105, and after a predetermined delay time, the main enable signal MainEN is generated (FIG. 11 (iv)). The main enable signal MainEN is supplied to the gate electrode of the main switch PMOS transistor 18. As a result, the main switch PMOS transistor 18 is turned on.

According to the fifth embodiment, the signal generation circuit 100 responding to the enable signal PwEN can generate a series of control signals which sequentially turn on the first pre-switch PMOS transistor 7, the second pre-switch PMOS transistor 22, and the main switch PMOS transistor 18, and then supply the control signals to the gate electrode of each of the transistors. After the output voltage VDDV of the second power supply line 4 rises to a certain degree, the second pre-switch PMOS transistor 22 is configured to be turned on, and thereby it is possible to suppress the inrush current from occurring by turning on the second pre-switch PMOS transistor 22.

Figure 12:
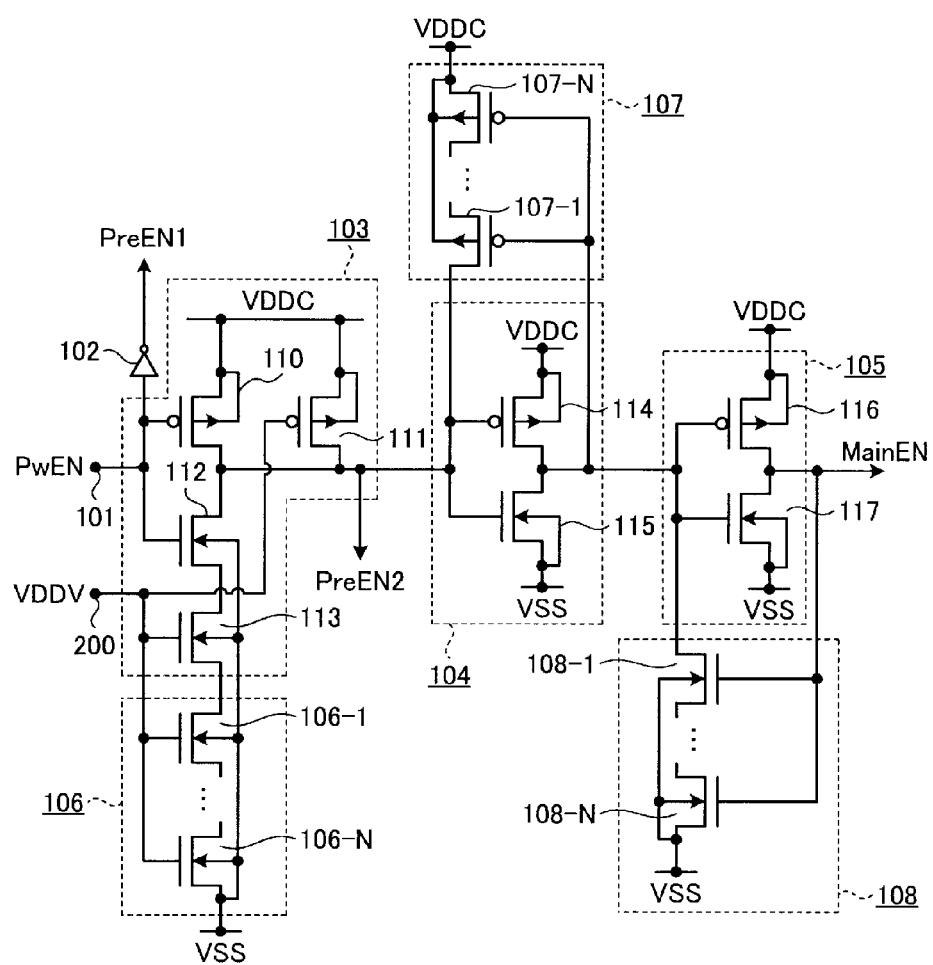
FIG. 12 is a diagram illustrating one embodiment of a signal generation circuit according to the fifth embodiment.

FIG. 12 is a diagram illustrating one embodiment of the signal generation circuit 100 according to the fifth embodiment. The NAND circuit 103 includes PMOS transistors 110 and 111 connected in parallel. Source electrodes and back gate electrodes of the PMOS transistors 110 and 111 are connected to the first power supply line 3. The NAND circuit 103 includes NMOS transistors 112 and 113 connected in series. Drain electrodes of the PMOS transistors 110 and 111 are connected to a drain electrode of the NMOS transistors 112. Gate electrodes of the PMOS transistor 110 and the NMOS transistor 112 are connected to an input terminal 101. The enable signal PwEN is applied to the input terminal 101.

A source electrode of the NMOS transistor 113 is connected to a drain electrode of an NMOS transistor 106-1. A source electrode of an Nth stage of NMOS transistor 106-N of which a source-drain current path is connected in series to an NMOS transistor 106-1 is connected to the third power supply line 5 and grounded. Back gate electrodes of the NMOS transistors 112 and 113, and the NMOS transistors 106-1 to 106-N are connected to the third power supply line 5 and grounded. Gate electrodes of the PMOS transistor 111, the NMOS transistor 113, and the NMOS transistors 106-1 to 106-N are connected to a terminal 200. The terminal 200 is connected to the second power supply line 4, and the output voltage VDDV is supplied to the terminal 200.

The NMOS transistors 106-1 to 106-N of which the source-drain current paths are connected in series configure an adjustment circuit 106 which adjusts a circuit threshold value of the NAND circuit 103. When the circuit threshold value of the NAND circuit 103 becomes high, adjustment is possible so as to output the second pre-enable signal PreEN2, in a state where the output voltage VDDV of the second power supply line 4 which is applied to the terminal 200 rises to a certain degree.

The inverter 104 includes a PMOS transistor 114 and an NMOS transistor 115. A source electrode and a back gate electrode of the PMOS transistor 114 are connected to the first power supply line 3. A source electrode and a back gate electrode of the NMOS transistor 115 are connected to the third power supply line 5. The second pre-enable signal PreEN2 which is an output signal of the NAND circuit 103 is supplied to gate electrodes of the PMOS transistor 114 and the NMOS transistor 115.

The gate electrode of the PMOS transistor 114 is connected to a drain electrode of a PMOS transistor 107-1. Source-drain current paths of PMOS transistors 107-1 and 107-N are connected in series to one another, a source electrode of the Nth stage of PMOS transistor 107-N is connected to the first power supply line 3, and the input power supply voltage VDDC is applied to the first power supply line 3. Back gate electrodes of the PMOS transistors 107-1 to 107-N are connected to the first power supply line 3. Gate electrodes of the PMOS transistors 107-1 to 107-N are connected to drain electrodes of the PMOS transistor 114 and the NMOS transistor 115, and an output signal of the inverter 104 is supplied to the gate electrodes of the PMOS transistors 107-1 to 107-N.

The PMOS transistors 107-1 to 107-N configure a pull-up circuit 107. The pull-up circuit 107 functions to pull the voltage of the second pre-enable signal PreEN2 which is the output signal of the NAND circuit 103 up to the input power supply voltage VDDC in a high potential side. For this reason, falling of the second pre-enable signal PreEN2 is gradual. As a result, the second pre-switch PMOS transistor 22 can be slowly turned on, and the inrush current occurring when the second pre-switch PMOS transistor 22 is turned on can be suppressed. When the output signal of the inverter 104 becomes a high level, the PMOS transistors 107-1 to 107-N configuring the pull-up circuit 107 are turned on, and thereby a pull-up function stops.

An inverter 105 includes a PMOS transistor 116 and an NMOS transistor 117. A source electrode and a back gate electrode of the PMOS transistor 116 are connected to the first power supply line 3 to which the input power supply voltage VDDC is applied. A source electrode and a back gate electrode of the NMOS transistor 117 are connected to the third power supply line 5 to which the ground potential VSS is applied. The output signal of the inverter 104 is supplied to gate electrodes of the PMOS transistors 116 and the NMOS transistor 117.

NMOS transistors 108-1 to 108-N configure a pull-down circuit 108. The pull-down circuit 108 functions to pull a voltage of the output signal of the inverter 104 down to the ground potential VSS. For this reason, rising of the input signal of the inverter 105 is gradual. As a result, the main enable signal MainEN which is the output signal of the inverter 105 falls slowly, and thus the main switch PMOS transistor 18 can be slowly turned on, and the inrush current occurring when the main switch PMOS transistor 18 is turned on can be suppressed. When the output signal of the inverter 105 becomes a low level, the NMOS transistors 108-1 to 108-N configuring the pull-down circuit 108 are turned off, and thereby a pull-down function stops.

(Sixth Embodiment)

Figure 13:
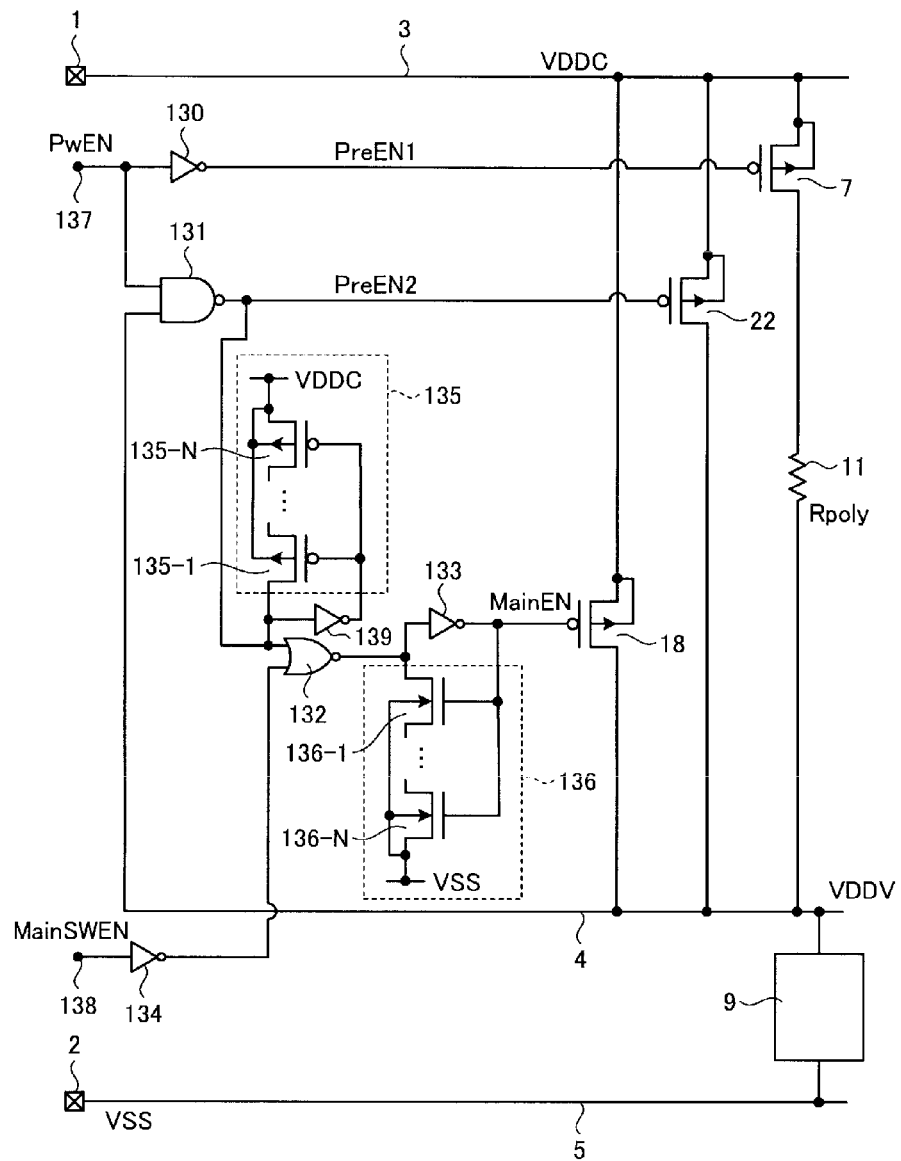
FIG. 13 is a diagram illustrating a semiconductor integrated circuit according to a sixth embodiment.

FIG. 13 is a diagram illustrating a semiconductor integrated circuit according to a sixth embodiment. The elements of the sixth embodiment corresponding to the above described embodiments are denoted by same reference numerals, and description thereof will not be repeated. In the embodiment, in addition to the enable signal PwEN, a main switch enable signal MainSWEN is supplied. The switch circuit is configured to start operating in a state where both signals are supplied. This is performed to reliably control the turning on time point of the main switch transistor.

The enable signal PwEN is supplied to a terminal 137. The main switch enable signal MainSWEN is supplied to a terminal 138. The enable signal PwEN is inverted by an inverter 130, and supplied to a gate electrode of the first pre-switch PMOS transistor 7, as the first pre-enable signal PreEN1. The enable signal PwEN is supplied to one input terminal of a NAND circuit 131, and the other input terminal of the NAND circuit 131 is connected to the second power supply line 4. An output signal of the NAND circuit 131 is supplied to the gate electrode of the second pre-switch PMOS transistor 22, as the second pre-enable signal PreEN2. The output voltage VDDV of the second power supply line 4 becomes the other input signal of the NAND circuit 131, and thereby the second pre-enable signal PreEN2 is output by the output voltage VDDV of the second power supply line 4 rising to a certain degree. As a result, it is possible to suppress the inrush current caused when the second pre-switch PMOS transistor 22 is turned on.

The output signal PreEN2 of the NAND circuit 131 is supplied to one input terminal of a NOR circuit 132. The main switch enable signal MainSWEN which is inverted by an inverter 134 is supplied to the other input terminal of the NOR circuit 132. A pull-up circuit 135 is connected to the input terminal of the NOR circuit 132 to which the output signal of the NAND circuit 131 is supplied. The pull-up circuit 135 includes PMOS transistors 135-1 to 135-N of which source-drain current paths are connected in series to one another. The input terminal of the NOR circuit 132 to which the output signal of the NAND circuit 131 is supplied is connected to a drain electrode of a PMOS transistor 135-1, and connected to gate electrodes of the PMOS transistors 135-1 to 135-N, through an inverter 139. A source electrode of the PMOS transistor 135-N is connected to the first power supply line 3, and the input power supply voltage VDDC is supplied to the first power supply line 3. Back gate electrodes of the PMOS transistors 135-1 to 135-N are connected to the first power supply line 3. The pull-up circuit 135 functions to pull the voltage of the output signal PreEN2 of the NAND circuit 131 up to the input power supply voltage VDDC over the first power supply line 3, namely the high potential side. For this reason, the falling of the second pre-enable signal PreEN2 is gradual, and thus it is possible to slowly turn on the second pre-switch PMOS transistor 22. As a result, it is possible to suppress the inrush current caused by the second pre-switch PMOS transistor 22 being turned on.

Since the second pre-enable signal PreEN2 is also supplied to the NOR circuit 132, rising of the output signal of the NOR circuit 132 is gradual by the gradual falling of the second pre-enable signal PreEN2. In addition, a pull-down circuit 136 is connected to an input terminal of an inverter 133. The pull-down circuit 136 includes NMOS transistors 136-1 to 136-N of which source-drain current paths are connected to one another in series. Gate electrodes of the NMOS transistors 136-1 to 136-N are connected to an output terminal of the inverter 133. A drain electrode of the NMOS transistor 136-1 is connected to the input terminal of the inverter 133. A source electrode of the NMOS transistor 136-N is connected to the third power supply line 5, and the ground potential VSS is applied to the third power supply line 5. Back gate electrodes of the NMOS transistors 136-1 to 136-N are connected to the third power supply line 5. The pull-down circuit 136 functions to pull a voltage of the input signal of the inverter 133 down to the ground potential VSS side. For this reason, rising of the input signal of the inverter 133 is gradual. As a result, falling of the main enable signal MainEN which is the output signal of the inverter 133 is gradual, and thus it is possible to slowly turn on the main switch PMOS transistor 18. As a result, it is possible to suppress the inrush current caused by the main switch PMOS transistor 18 being turned on.

Figure 14:
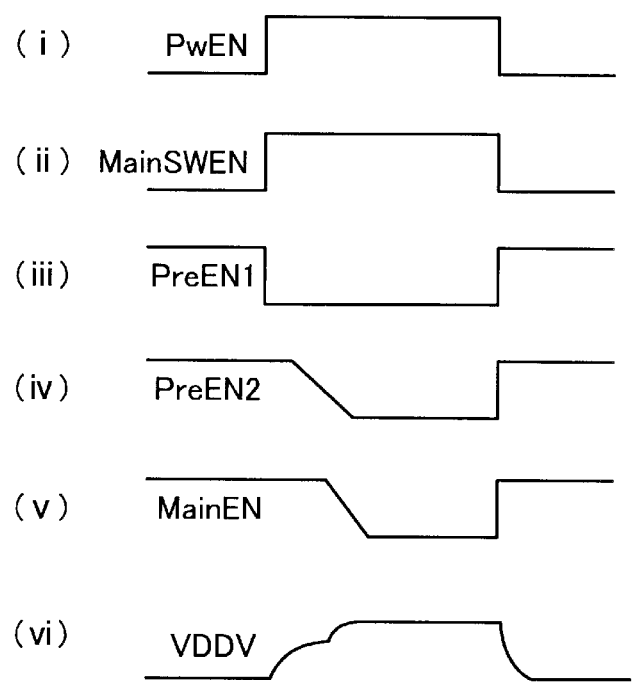
FIG. 14 is a diagram schematically illustrating operational waveforms of the semiconductor integrated circuit according to the sixth embodiment.

FIG. 14 is a diagram schematically illustrating operational waveforms of the semiconductor integrated circuit according to the sixth embodiment. The enable signal PwEN and the main switch enable signal MainSWEN are supplied to the terminal 137 and the terminal 138, respectively (FIGS. 14(*i*) and 14(*ii*)). The enable signal PwEN is inverted by the inverter 130, thereby the first pre-enable signal PreEN1 is generated (FIG. 14(*iii*)), and supplied to the gate electrode of the first pre-switch PMOS transistor 7. As a result, the first pre-switch PMOS transistor 7 is turned on.

The NAND circuit 131 to which the enable signal PwEN and the output voltage VDDV over the second power supply line 4 are input outputs the second pre-enable signal PreEN2 (FIG. 14(*iv*)). When the output voltage VDDV in the second power supply line 4 is in a state of rising to a certain degree, the NAND circuit 131 outputs the second pre-enable signal PreEN2. In addition, the second pre-enable signal PreEN2 falls slowly due to a pull-up operation caused by the pull-up circuit 135. As a result, the second pre-switch PMOS transistor 22 is slowly turned on, and the inrush current is suppressed.

The output signal of the NOR circuit 132 to which the inverted signal of the main switch enable signal MainSWEN and the second pre-enable signal PreEN2 which is the output signal of the NAND circuit 131 are supplied is inverted by the inverter 133, and thereby the main enable signal MainEN is generated (FIG. 14(v)). The falling of the main enable signal MainEN is made gradual by a pull-down function of the pull-down circuit 136. The main enable signal MainEN of which falling has been made gradual is supplied, and thereby the main switch PMOS transistor 18 is slowly turned on. As a result, the inrush current caused by the main switch PMOS transistor 18 being turned on is suppressed. The output voltage VDDV in the second power supply line 4 rises by the first pre-switch PMOS transistor 7 being turned on, and rises up to approximately the input power supply voltage VDDC when the second pre-switch PMOS transistor 22 is turned on (FIG. 14(vi)).

In general, according to the embodiments, turning on and off of the main switch PMOS transistor 18 is controlled by both the enable signal PwEN and the main switch enable signal MainSWEN. For this reason, the operation timing of turning on the main switch PMOS transistor 18 can be reliably controlled by the main switch enable signal MainSWEN. In addition, the second pre-switch PMOS transistor 22 and the main switch PMOS transistor 18 are controlled to be slowly turned on, and thereby the inrush current when each transistor is turned on can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a first power supply line to which an input power supply voltage is to be applied;
a second power supply line configured to supply a bias voltage to a load circuit;
a first PMOS transistor having a source-drain current path connected between the first power supply line and the second power supply line, and a gate electrode;
an NMOS transistor having a source-drain current path connected between the first power supply line and the second power supply line, and a gate electrode, and wherein a back gate electrode of the NMOS transistor is connected to the source electrode of the NMOS transistor; and
a control circuit configured to generate a first control signal that is supplied to the gate electrode of the first PMOS transistor at a first point in time, and a second control signal that is boosted to have a voltage level higher than the input power supply voltage and then supplied to the gate electrode of the NMOS transistor at a second point in time that is a predetermined time after the first point in time.

2. The circuit according to claim 1, wherein
the voltage level of the boosted second control signal is set with respect to a rated voltage between a gate electrode and a source electrode of the NMOS transistor.

3. The circuit according to claim 2, wherein
the voltage level of the boosted second control signal is set to be twice the input power supply voltage.

4. The circuit according to claim 1, further comprising:
a resistor having a first end connected to a drain electrode of the first PMOS transistor and a second end connected to the second power supply line; and
a second PMOS transistor having a source electrode connected to the first end of the resistor, a drain electrode connected to the second end of the resistor, and a gate electrode,
wherein the control circuit is configured to generate a third control signal that is supplied to the gate electrode of the second PMOS transistor at a third point in time between the first and second points in time.

5. The circuit according to claim 4, wherein the resistor is formed of polysilicon.

6. A semiconductor integrated circuit comprising:
a first power supply line to which an input power supply voltage is to be applied;
a second power supply line configured to supply a bias voltage to a load circuit;
a first MOS transistor having a source-drain current path connected between the first power supply line and the second power supply line, and a gate electrode;
a resistor connected in series to the source-drain current path of the first MOS transistor between the first power supply line and the second power supply line;
a second MOS transistor having a source-drain current path connected between the first power supply line and the second power supply line, and a gate electrode;
a third MOS transistor having a source electrode connected to a first end of the resistor, and a drain electrode connected to a second end of the resistor; and
a control circuit configured to generate a first control signal and supply the first control signal to the gate electrode of the first MOS transistor at a first point in time, and generate a second control signal and supply the second control signal to the second MOS transistor at a second point in time that is a predetermined time after the first point in time, wherein the control circuit is further configured to generate a third control signal that is supplied to a gate electrode of the third MOS transistor at a third point in time between the first and second points in time.

7. The circuit according to claim 6, wherein the first, second, and third MOS transistors are each a PMOS transistor.

8. The circuit according to claim 6, wherein the first, second, and third MOS transistors are each a PMOS transistor.

9. The circuit according to claim 6, wherein the control circuit includes a logic circuit which is configured to receive a voltage of the second power supply line and an enable signal, and generate an output signal as the third control signal.

10. The circuit according to claim 9, wherein the control circuit further includes a pull-up circuit configured to pull up a voltage of the output signal.

11. The circuit according to claim 6, wherein the resistor is formed of polysilicon.

12. A semiconductor integrated circuit comprising:
a first power supply line to which an input power supply voltage is to be applied;
a second power supply line configured to supply a bias voltage to a load circuit;

a PMOS transistor having a source-drain current path connected between the first power supply line and the second power supply line;

an NMOS transistor having a source-drain current path connected between the first power supply line and the second power supply line; and a control circuit configured to generate a first control signal for turning on the PMOS transistor at a first point in time, and a second control signal for turning on the NMOS transistor at a second point in time that is after the first point in time, wherein the first control signal is inverted before it is supplied to a gate electrode of the PMOS transistor to turn on the PMOS transistor, and the second control signal is boosted to have a voltage level twice the input power supply voltage before it is supplied to a gate electrode of the NMOS transistor to turn on the NMOS transistor.

13. The circuit according to claim 12, further comprising:

a resistor having a first end connected to a drain electrode of the PMOS transistor and a second end connected to the second power supply line.

14. The circuit according to claim 13, further comprising:

a second PMOS transistor having a source electrode connected to the first end of the resistor, and a drain electrode connected to the second end of the resistor, wherein the control circuit is configured to generate a third control signal for turning on the second PMOS transistor after the first PMOS transistor and before the NMOS transistor.

15. The circuit according to claim 14, wherein the resistor is formed of polysilicon.

* * * * *